(12) United States Patent
Towle et al.

(10) Patent No.: US 7,067,356 B2
(45) Date of Patent: Jun. 27, 2006

(54) METHOD OF FABRICATING MICROELECTRONIC PACKAGE HAVING A BUMPLESS LAMINATED INTERCONNECTION LAYER

(75) Inventors: Steven Towle, Sunnyvale, CA (US); Paul H. Wermer, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 321 days.

(21) Appl. No.: 10/424,383

(22) Filed: Apr. 28, 2003

(65) Prior Publication Data

US 2003/0227077 A1 Dec. 11, 2003

Related U.S. Application Data

(62) Division of application No. 09/738,117, filed on Dec. 15, 2000, now Pat. No. 6,555,906.

(51) Int. Cl.
*H01L 21/44* (2006.01)
*H01L 21/48* (2006.01)
*H01L 21/50* (2006.01)

(52) U.S. Cl. .............. 438/122; 438/106; 438/124; 438/126; 438/127; 257/723

(58) Field of Classification Search ......... 438/106–107, 438/110, 113, 118, 119, 121, 122, 124–127, 438/108; 257/701, 712, 723, 787, 706, 707, 257/738, 796
See application file for complete search history.

(56) References Cited

U.S. PATENT DOCUMENTS

| | | | |
|---|---|---|---|
| 3,903,590 A | 9/1975 | Yokogawa | 29/577 |
| 5,013,871 A | 5/1991 | Mahulikar et al. | 174/52.4 |
| 5,353,498 A | 10/1994 | Fillion et al. | 29/840 |
| 5,359,496 A | 10/1994 | Kornrumpf et al. | 361/795 |
| 5,384,955 A | 1/1995 | Booth et al. | 29/830 |
| 5,409,865 A * | 4/1995 | Karnezos | 29/827 |
| 5,422,513 A | 6/1995 | Marcinkiewicz et al. | 257/668 |
| 5,497,033 A | 3/1996 | Fillion et al. | 257/723 |
| 5,527,741 A | 6/1996 | Cole et al. | 437/209 |
| 5,703,400 A | 12/1997 | Wojnarowski et al. | 257/723 |
| 5,745,984 A | 5/1998 | Cole, Jr. et al. | 29/834 |
| 5,998,859 A * | 12/1999 | Griswold et al. | 257/679 |
| 6,091,250 A * | 7/2000 | Wood et al. | 324/755 |
| 6,154,366 A | 11/2000 | Ma et al. | 361/704 |
| 6,423,570 B1 * | 7/2002 | Ma et al. | 438/106 |
| 6,555,906 B1 * | 4/2003 | Towle et al. | |
| 6,706,553 B1 * | 3/2004 | Towle et al. | 438/106 |

FOREIGN PATENT DOCUMENTS

| | | |
|---|---|---|
| EP | 0110285 | 6/1984 |
| EP | 0246447 | 11/1987 |
| EP | 0579438 | 1/1994 |
| FR | 2572849 | 5/1986 |

OTHER PUBLICATIONS

Pham, A , et al., "Development of a Millimeter–Wave System–on–a–Package Utilizing MCM Integration", *IEEE Transactions on Microwave Theory and Techniques*, 49, N.Y, U.S., (2001), 1747–1749.

* cited by examiner

*Primary Examiner*—Amir Zarabian
*Assistant Examiner*—Khanh Duong
(74) *Attorney, Agent, or Firm*—Schwegman, Lundberg, Woessner & Kluth, P.A.

(57) ABSTRACT

A microelectronic device fabrication technology that places at least one microelectronic die within at least one opening in a microelectronic package core and secures the microelectronic die/dice within the opening(s) with an encapsulation material, that encapsulates at least one microelectronic die within an encapsulation material without a microelectronic package core, or that secures at least one microelectronic die within at least one opening in a heat spreader. A laminated interconnector of dielectric materials and conductive traces is then attached to the microelectronic die/dice and at least one of following: the encapsulation material, the microelectronic package core, and the heat spreader, to form a microelectronic device.

20 Claims, 14 Drawing Sheets

METHOD OF FABRICATING MICROELECTRONIC PACKAGE HAVING A BUMPLESS LAMINATED INTERCONNECTION LAYER

This application is a divisional of U.S. patent application Ser. No. 09/738,117, filed Dec. 15, 2000 now issued as U.S. Pat. No. 6,555,906, which is herein incorporated by reference.

BACKGROUND OF THE INVENTION

1. Field of the Invention

The present invention relates to apparatus and processes for the fabrication of a microelectronic device. In particular, the present invention relates to a fabrication technology that encapsulates at least one microelectronic die and provides a laminated interconnection layer for achieving electronic contact therewith.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 35, true CSP involves fabricating build-up layers directly on an active surface 404 of a microelectronic die 402. The build-up layers may include a dielectric layer 406 disposed on the microelectronic die active surface 404. Conductive traces 408 may be formed on the dielectric layer 406, wherein a portion of each conductive trace 408 contacts at least one contact 412 on the active surface 404. External contacts, such as solder balls or conductive pins for contact with an external component (not shown), may be fabricated to electrically contact at least one conductive trace 408. FIG. 35 illustrates the external contacts as solder balls 414, which are surrounded by a solder mask material 416 on the dielectric layer 406. However, in such true CSP, the surface area provided by the microelectronic die active surface 404 generally does not provide enough surface for all of the external contacts needed to contact the external component (not shown) for certain types of microelectronic dice (e.g., logic).

Additional surface area can be provided through the use of an interposer, such as a substrate (substantially rigid material) or a flex component (substantially flexible material). FIG. 36 illustrates a substrate interposer 422 having a microelectronic die 424 attached to and in electrical contact with a first surface 426 of the substrate interposer 422 through small solder balls 428. The small solder balls 428 extend between contacts 432 on the microelectronic die 424 and conductive traces 434 on the substrate interposer first surface 426. The conductive traces 434 are in discrete electrical contact with bond pads 436 on a second surface 438 of the substrate interposer 422 through vias 442 that extend through the substrate interposer 422. External contacts 444 (shown as solder balls) are formed on the bond pads 436. The external contacts 444 are utilized to achieve electrical communication between the microelectronic die 424 and an external electrical system (not shown).

The use of the substrate interposer 422 requires a number of processing steps. These processing steps increase the cost of the package. Additionally, even the use of the small solder balls 428 presents crowding problems which can result in shorting between the small solder balls 428 and can present difficulties in inserting underfill material between the microelectronic die 424 and the substrate interposer 422 to prevent contamination and provide mechanical stability. Furthermore, current packages may not meet power delivery requirements for future microelectronic dice 424 due to thickness of the substrate interposer 422, which causes land-side capacitors to have too high an inductance.

FIG. 37 illustrates a flex component interposer 452 wherein an active surface 454 of a microelectronic die 456 is attached to a first surface 458 of the flex component interposer 452 with a layer of adhesive 462. The microelectronic die 456 is encapsulated in an encapsulation material 464. Openings are formed in the flex component interposer 452 by laser ablation through the flex component interposer 452 to contacts 466 on the microelectronic die active surface 454 and to selected metal pads 468 residing within the flex component interposer 452. A conductive material layer is formed over a second surface 472 of the flex component interposer 452 and in the openings. The conductive material layer 482 is patterned with standard photomask/etch processes to form conductive vias 474 and conductive traces 476. External contacts are formed on the conductive traces 476 (shown as solder balls 478 surrounded by a solder mask material 482 proximate the conductive traces 476).

The use of a flex component interposer 452 requires gluing material layers which form the flex component interposer 452 and requires gluing the flex component interposer 452 to the microelectronic die 456. These gluing processes are relatively difficult and increase the cost of the package. Furthermore, the resulting packages have been found to have poor reliability.

Therefore, it would be advantageous to develop new apparatus and techniques to provide additional surface area to form traces for use in CSP applications, which overcomes the above-discussed problems.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
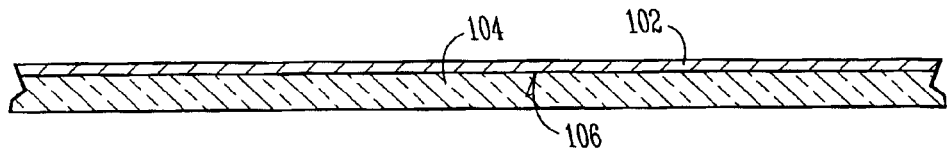
FIGS. 1–8 are side cross-sectional views illustrating a method of forming a laminated interconnector.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes a microelectronic device fabrication technology that places at least one microelectronic die within at least one opening in a microelectronic package core and secures the microelectronic die/dice within the opening(s) with an encapsulation material, that encapsulates at least one microelectronic die within an encapsulation material without a microelectronic package core, or that secures at least one microelectronic die within at least one opening in a heat spreader. A laminated interconnector of dielectric materials and conductive traces is then attached to the microelectronic die/dice and at least one of following: the encapsulation material, the microelectronic package core, and the heat spreader, to form a microelectronic device.

Figure 2:
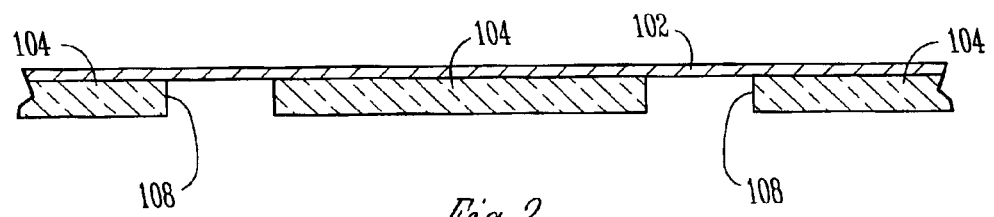

FIGS. 1–8 illustrate a method for forming a laminated interconnector. As shown in FIG. 1, a metal foil 102, such as copper, copper alloys, aluminum, aluminum alloys, etc., is laminated with a first surface 106 of a dielectric layer 104, such as a glass-epoxy material (e.g., FR4 material), epoxy resin, polyimides, and the like. At least one opening 108 is formed through the dielectric layer 104 to expose a portion of the metal foil 102, as shown in FIG. 2. The metal foil 102/dielectric layer 104 laminate may then be cleaned (desmeared).

Figure 3:
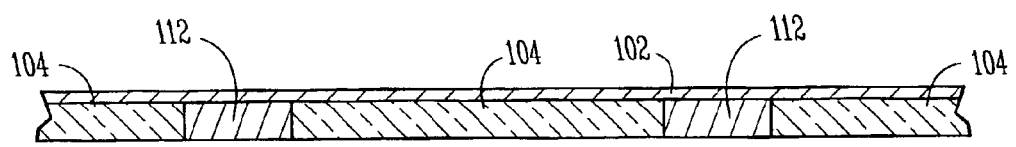
Figure 4:
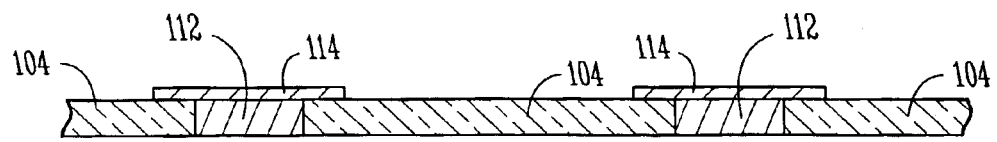
Figure 5:
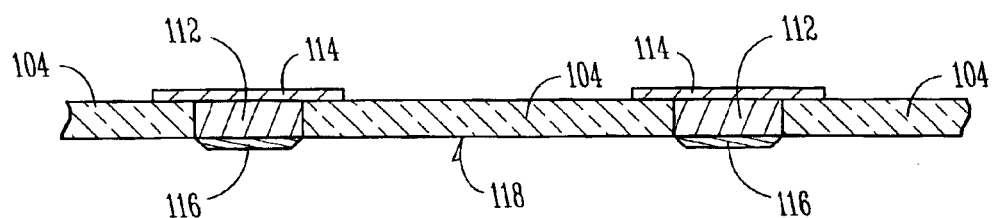
Figure 6:
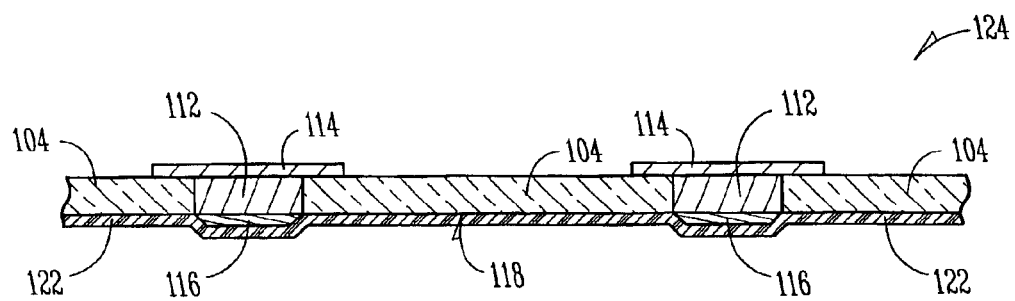
Figure 7:
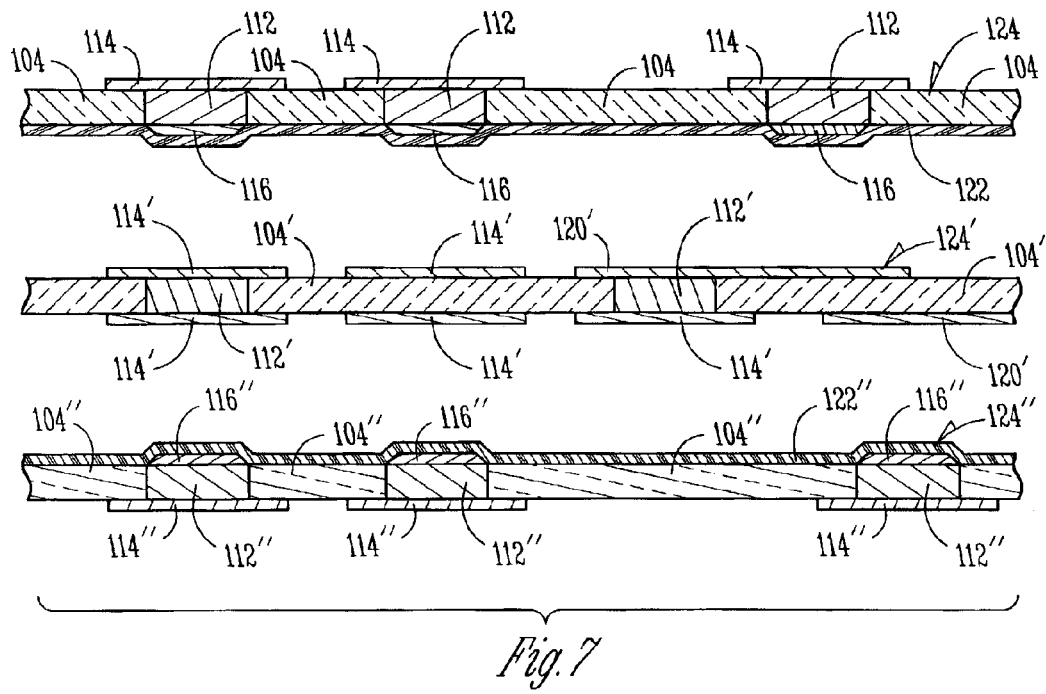

As shown in FIG. 3, the openings 108 (see FIG. 2) are filled with a conductive material, such as by a metal using a plating technique as will be understood by those skilled in the art, to form conductive plugs 112. As shown in FIG. 4, the metal foil 102 is then patterned, such as by a lithography and etch technique, to form at least one conductive element, such as lands 114 and traces 120 (not shown [see FIG. 16]). As shown in FIG. 5, a conductive bonding layer 116, such as a tin/lead solder, lead-free solder (e.g., tin/silver and tin/silver/copper solders), conductive adhesives (e.g., metal filled epoxy), and the like, is formed on the conductive plugs 112 adjacent a second surface 118 of the dielectric layer 104. This conductive bonding layer 116 can be applied by a variety of commonly used methods, including but not limited to plating the solder or solder alloy, screen printing a paste (either a conductive adhesive or a solder paste), using the Furukawa Super Solder Process, using the Super Juffit Process, and the like. An adhesive layer 122 may then be disposed over the dielectric layer second surface 118 and the conductive bonding layers 116 to form a lamination structure 124, as shown in FIG. 6. A plurality of lamination structures 124, 124', 124" are aligned, as shown in FIG. 7. It is noted that lamination structure 124' has conductive plugs 112' and lands 114', and may include traces 120', formed on opposing surfaces of the dielectric layer 104' without the conductive bonding layers and adhesive layers, as such layers are provided by the adjacent lamination structures 124 and 124".

Figure 8:
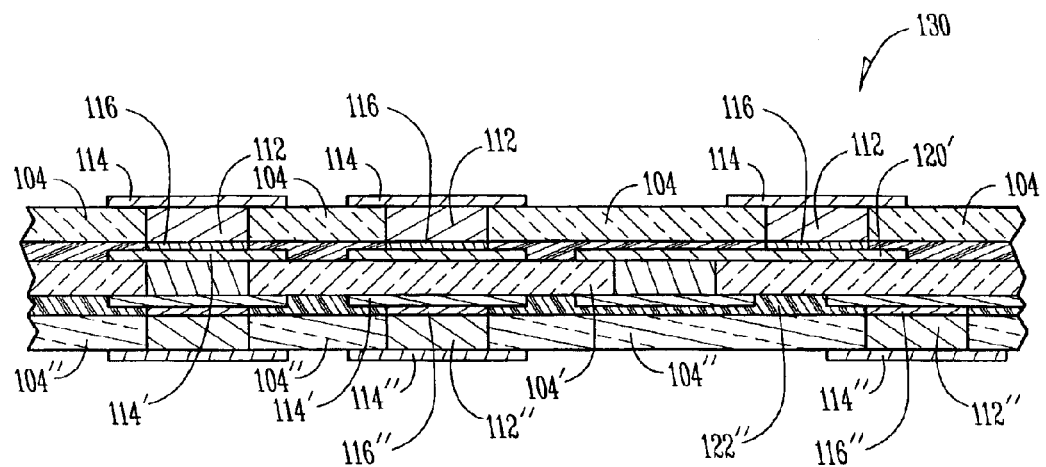

The plurality of single lamination structures 124, 124' and 124" are then subjected to a vacuum hot press process to form a laminated interconnector 130, as shown in the FIG. 8. The vacuum hot process result in the conductive bonding layers 116 of one single lamination structure (124, 124', and/or 124") bonding to the lands (114, 114', and/or 114") and traces 120' of an adjacent single lamination structure, as demonstrated in FIG. 8. It is, of course, understood that the laminated interconnector 130 is not limited to three layers, but may comprise fewer or more layers. Such laminated interconnectors 130 are available from Ibiden U.S.A. Corp., Santa Clara, Calif., U.S.A. Other laminated interconnectors with substantially similar characteristics but produced by different manufacturing processes are available from Matsushita Electronic Components Co., Ltd., Osaka, Japan (for example: ALIVH (Any Layer Inner Via Hole)) and CTS Corporation, Elkhart, Ind., USA (for example: ViaPly). Other processes, such as Ibiden's IBSS or Baby Yasha technologies, or Shinko's DLL process (Shinko Electric Industries, Co., Ltd., Manila, Philippines) can also be used. In this case the solder bumps currently used in the conventional flip chip application would be replaced by a plated metal stud (copper or other suitable metal or alloy). After fabrication, the laminated interconnector 130 may be tested for functionality by electrical testing using an appropriate test fixture, or by other means.

Figure 9:
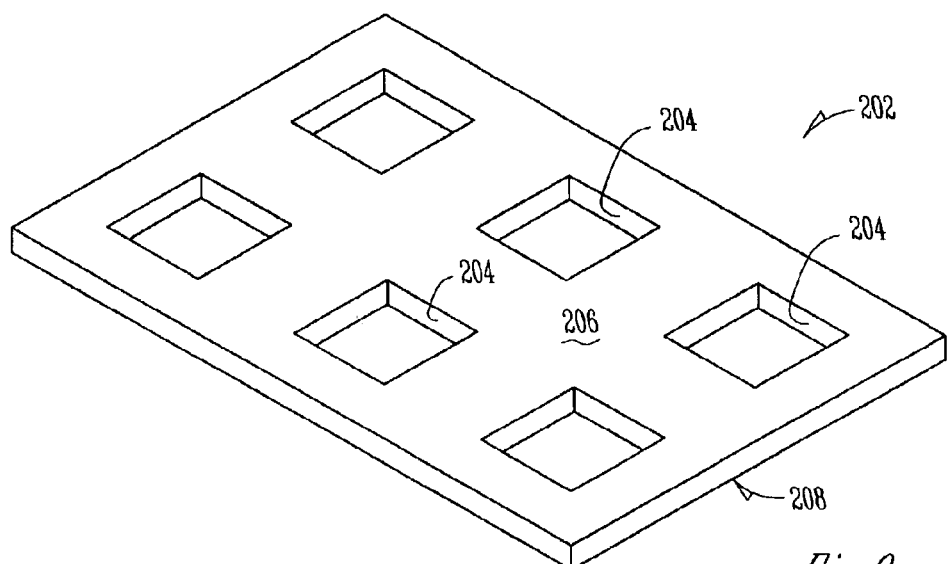
FIGS. 9 and 10 are an oblique view and a top plan view, respectively, of a package core that may be used in an embodiment of the present invention.
Figure 10:
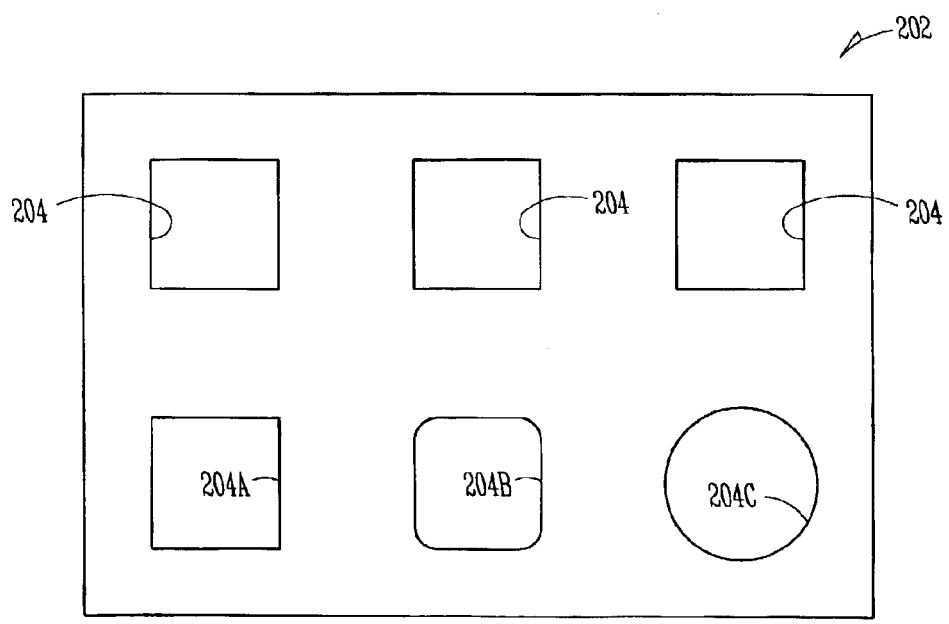

FIGS. 9–19 illustrate a method of forming a microelectronic device. FIG. 9 illustrates a microelectronic package core 202 used to fabricate the microelectronic device. The microelectronic package core 202 preferably comprises a substantially planar material. The material used to fabricate the microelectronic package core 202 may include, but is not limited to, a Bismaleimide Triazine ("BT") resin based laminate material, an FR4 laminate material (a flame retarding glass/epoxy material), various polyimide laminate materials, ceramic material, and the like, and metallic materials (such as copper) and the like. The microelectronic package core 202 has at least one opening 204 extending therethrough from a first surface 206 of the microelectronic package core 202 to an opposing second surface 208 of the microelectronic package core 202. As shown in FIG. 10, the opening(s) 204 may be of any shape and size including, but not limited to, rectangular/square 204a, rectangular/square with rounded corners 204b, and circular 204c. The only limitation on the size and shape of the opening(s) 204 is that they must be appropriately sized and shaped to house a corresponding microelectronic die or dice therein, as will be discussed below.

Figure 11:
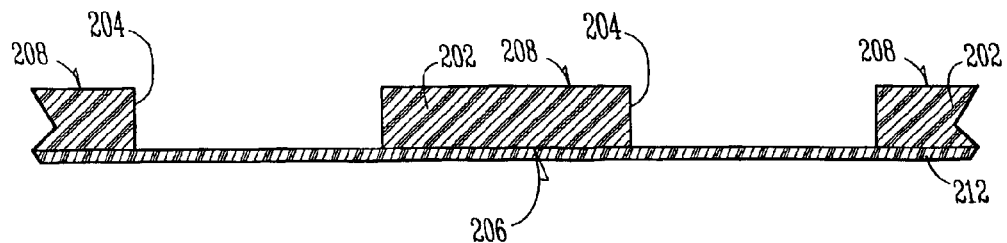
FIGS. 11–19 are side cross-sectional views of a method of fabricating a microelectronic package with a package core, according to the present invention.
Figure 12:
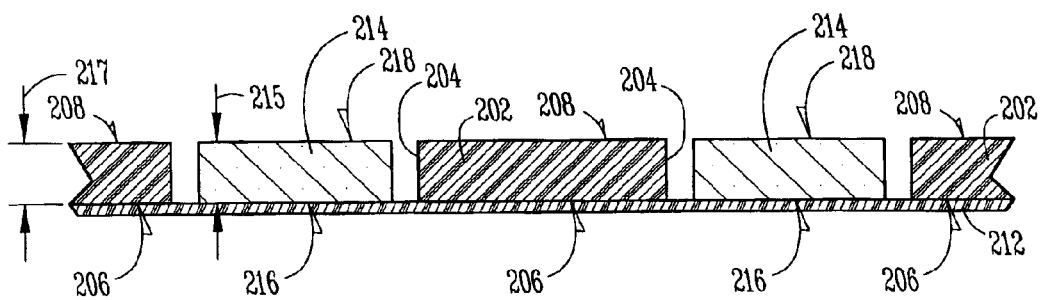

FIG. 11 illustrates the microelectronic package core first surface 206 abutting a protective film 212. The protective film 212 is preferably a substantially flexible material, such as Kapton® polyimide film (E. I. du Pont de Nemours and Company, Wilmington, Del.), but may be made of any appropriate material, including metallic films. In a preferred embodiment, the protective film 212 would have substantially the same coefficient of thermal expansion (CTE) as the microelectronic package core. FIG. 12 illustrates microelectronic dice 214, each having an active surface 216 and a back surface 218, placed in corresponding openings 204 of the microelectronic package core 202. The microelectronic dice 214 may be any known active or passive microelectronic device including, but not limited to, logic (CPUs), memory (DRAM, SRAM, SDRAM, etc.), controllers (chip sets), capacitors, resistors, inductors, and the like. The microelectronic dice 214 are preferably tested, electrically and/or otherwise, to eliminate non-functioning dice prior to use.

In one embodiment (illustrated), the thickness 217 of the microelectronic package core 202 and the thickness 215 of the microelectronic dice 214 are substantially equal. The microelectronic dice 214 are each placed such that their active surfaces 216 abut the protective film 212. The protective film 212 may have an adhesive, such as silicone or acrylic, which attaches to the microelectronic package core first surface 206 and the microelectronic die active surface 216. This adhesive-type film may be applied prior to placing the microelectronic die 214 and microelectronic package core 202 in a mold, liquid dispense encapsulation system (preferred), vacuum press, or other piece of equipment used for the encapsulation process. The protective film 212 may also be a non-adhesive film, such as a ETFE (ethylene-tetrafluoroethylene) or Teflon® film, which is held on the microelectronic die active surface 216 and the microelectronic package core first surface 206 by an inner surface of the mold or other piece of equipment during the encapsulation process. In another embodiment, the microelectronic die 214 and microelectronic package core 202 may be held in place (with an adhesive, a vacuum chuck, or the like) against a reusable platen in place of the tape.

Figure 13:
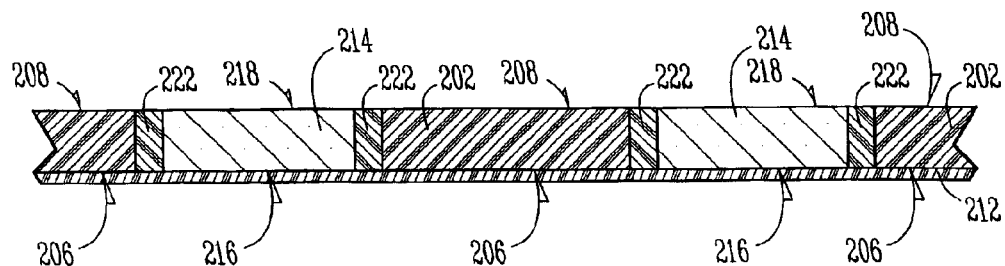

The microelectronic die 214 is then encapsulated with an encapsulation material 222, such as plastics, resins, epoxies, elastomeric (i.e., rubbery) materials, and the like. As shown in FIG. 13, the encapsulation material 222 is disposed in portions of the opening(s) 204 not occupied by the microelectronic die 214. The encapsulation of the microelectronic die 214 may be achieved by any known process, including but not limited to transfer and compression molding, and dispensing. The encapsulation material 222 secures the microelectronic die 214 within the microelectronic package core 202, which provides mechanical rigidity for the resulting structure and provides surface area for subsequently attaching a laminated interconnector.

Figure 14:
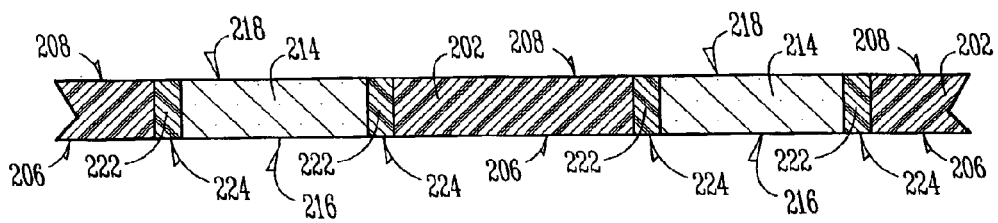

After encapsulation, the protective film 212 is removed, as shown in FIG. 14, to expose the microelectronic die active surface 216. As also shown in FIG. 14, the encapsulation material 222 is preferably molded or dispensed to fill the space between the microelectronic package core first surface 206 and the microelectronic die active surface 216. This results in at least one surface 224 of the encapsulation material 222 that is substantially planar to the microelectronic die active surface 216 and the microelectronic package core first surface 206.

Figure 15:
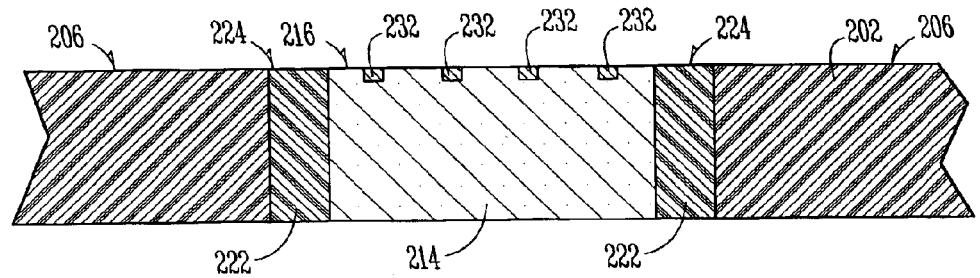
Figure 16:
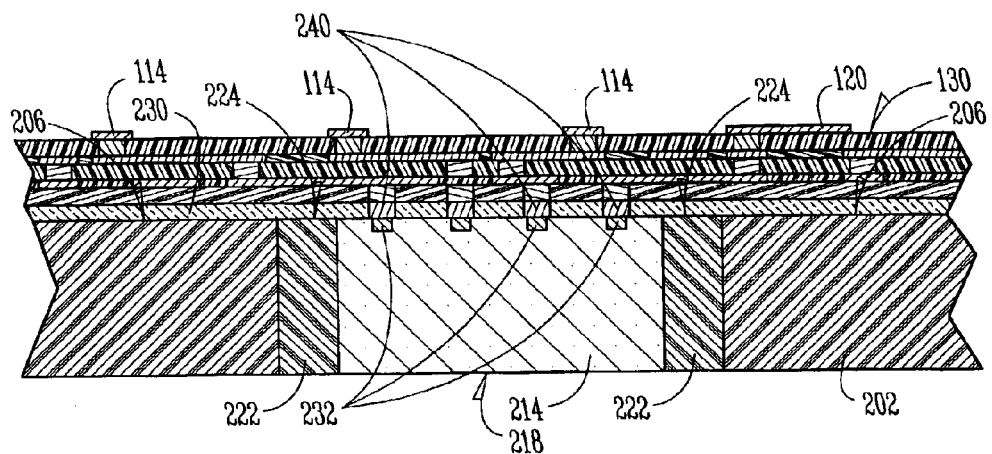

FIG. 15 illustrates a view of a single microelectronic die 214 encapsulated with encapsulation material 222 within the microelectronic package core 202. The microelectronic die 214, of course, includes a plurality of electrical contacts 232 located on the microelectronic die active surface 216. The electrical contacts 232 are electrically connected to circuitry (not shown) within the microelectronic die 214. Only four electrical contacts 232 are shown for sake of simplicity and clarity, As shown in FIG. 16, the laminated interconnector 130 (prefabricated) is abutted against and makes contact with the electrical contacts 232. To form a mechanical and electrical connection with an embedded microelectronic die 214, a layer between the laminated interconnector 130 and the embedded microelectronic die must include appropriate dielectric material 230 (such as glass-epoxy material (e.g., FR4 material), epoxy resin, polyimides, and the like) and conductive adhesive material 240 (such as metal-filled epoxy resins, and the like). In a preferred embodiment, these adhesive materials would be applied after the formation of the lamination of the laminated 130. Depending on alignment issues, it may be possible to put traces on the level that abuts the microelectronic die 214. If it is not possible to put traces on the level that abuts the microelectronic die 214, the laminated interconnector 130 would have to be built in such a way that the side toward the microelectronic die 214 has no traces disposed thereon.

Figure 17:
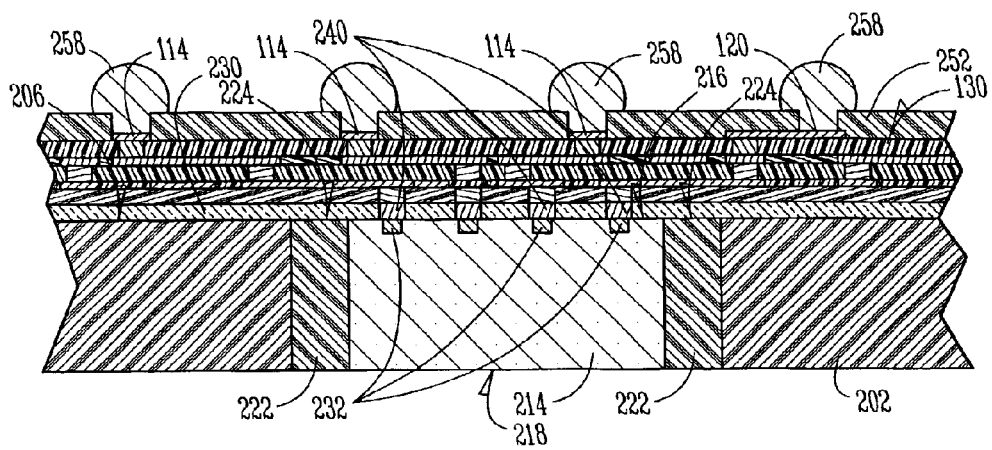

As shown in FIG. 17, after the laminated interconnector 130 is attached, the lands 114 can be used in the formation of conductive interconnects, such as solder bumps, solder balls, pins, and the like, for communication with external components (not shown). For example, a solder mask material 252 can be disposed over the laminated interconnector 130. A plurality of vias are then formed in the solder mask material 252 to expose at least a portion of each of the lands 114 or traces 120. A plurality of conductive bumps 258, such as solder bumps, can be formed, such as by screen printing solder paste followed by a reflow process or by known plating techniques, on the exposed portion of each of the lands 114 or traces 120.

Figure 18:
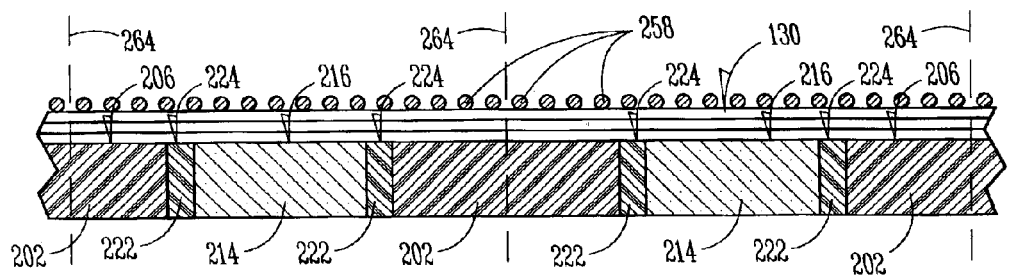
Figure 19:
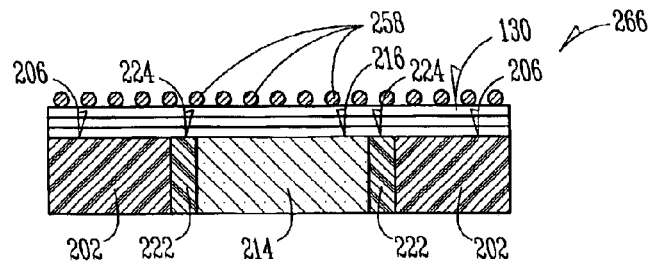

FIG. 18 illustrates a plurality of microelectronic dice 214 encapsulated with encapsulation material 222 within the microelectronic package core 202 The laminated interconnector 130 is attached to the microelectronic dice active surfaces 216, the microelectronic package core first surface 206, and the encapsulation material surface 224 in the manner previously discussed. The individual microelectronic dice 214 are then singulated along lines 264 (cut) through the laminated interconnector 130 and the microelectronic package core 202 to form at least one singulated microelectronic die package 266, as shown in FIG. 19. It is also understood that the individual microelectronic die 214 may be singulated first and a singulated interconnector 130 attached thereto, which may eliminate die-to-die alignment problems, to form the singulated microelectronic die package 266 directly.

In a preferred embodiment, "known good" (i.e., tested by electrical or other means) microelectronic dice 214 would be incorporated in the microelectronic package core 202 only in positions corresponding to known good laminated interconnectors 130. Thus, loss of known good microelectronic dice 214 due to being attached to a non-functioning laminated interconnector 130 could be avoided. It is understood that the microelectronic die packages may also be formed by attaching individual singulated laminated connectors to individual encapsulated singulated microelectronic dice.

It is, of course, understood that a plurality of microelectronic dice 214 could be encapsulated with encapsulation material 222 within a single opening 204 of the microelectronic package core 202.

Figure 20:
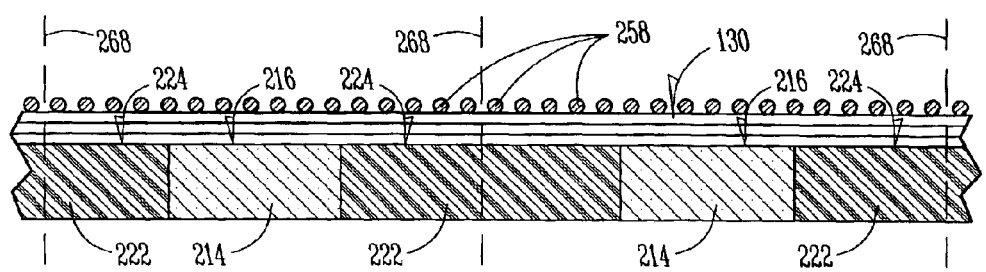
FIGS. 20 and 21 are side cross-sectional views of the microelectronic packages without a package core, according to the present invention.
Figure 21:
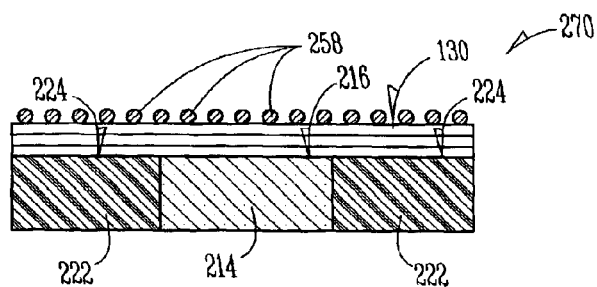

It is further understood that the microelectronic package core 202 is optional. The microelectronic dice 214 may simply be encapsulated in encapsulation material 222, as shown in FIG. 20. The individual dice 214 are then singulated along lines 268 (cut) through the laminated interconnector 130 and the encapsulation material 222 to form at least one singulated microelectronic die package 270, as shown in FIG. 21. It is also understood that the individual microelectronic die 214 may be simulated first and a singulated interconnector 130 attached thereto, which may eliminate die-to-die alignment problems, to form the singulated microelectronic die package 270 directly.

Figure 22:
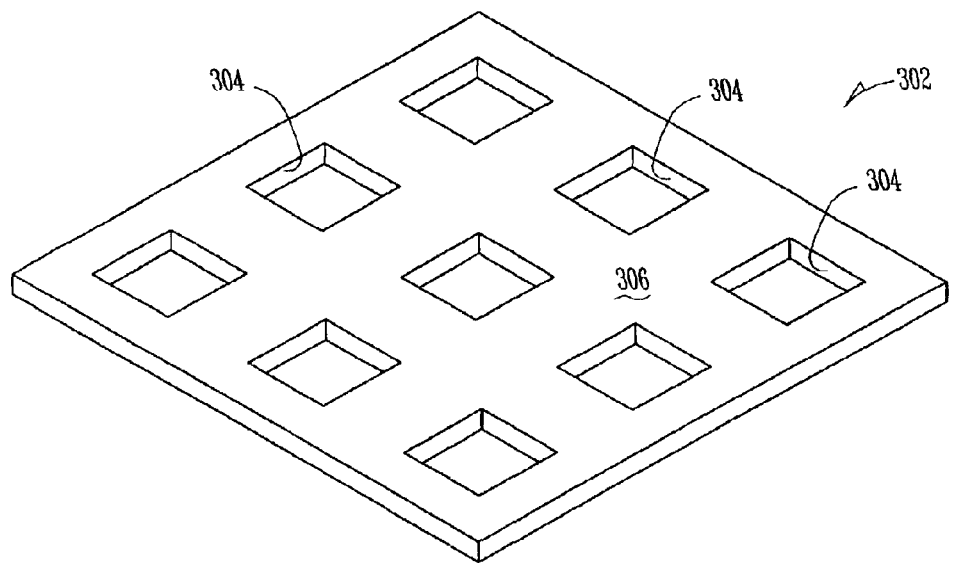
FIG. 22 is an oblique view of a heat spreader that may be used in one embodiment of the present invention.
Figure 23:
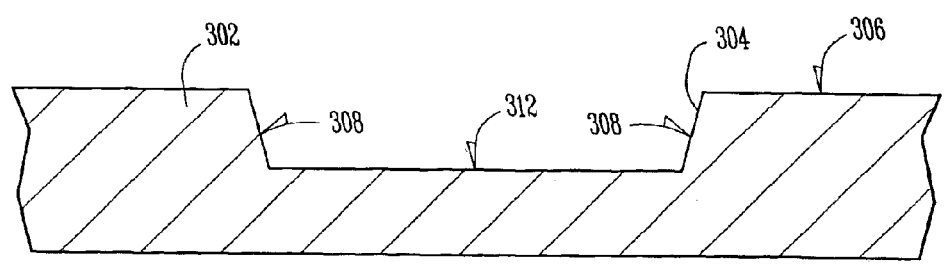
FIGS. 23–34 are side cross-sectional views of various methods of forming a microelectronic package with a heat spreader, according to the present invention.

In another embodiment of the present invention, a heat spreader may be incorporated into a microelectronic die package. FIG. 22 illustrates a heat spreader 302 which may be used to fabricate a microelectronic package. The heat spreader 302 preferably comprises a substantially planar, highly thermally conductive material. The material used to fabricate the heat spreader 302 may include, but is not limited to, metals, such as copper, copper alloys, molybdenum, molybdenum alloys, aluminum, aluminum alloys, and the like. The material used to fabricate the heat spreader may also include, but is not limited to, thermally conductive ceramic materials, such as AlSiC, AlN, and the like. It is further understood that the heat spreader 302 could be a more complex device such as a heat pipe. The heat spreader 302 has at least one recess 304 extending into the heat spreader 302 from a first surface 306 thereof. FIG. 23 illustrates a side cross-sectional view of the heat spreader 302. Each recess 304 is defined by at least one sidewall 308, which may be sloped to assist in the alignment of a microelectronic die, and a substantially planar bottom surface 312. Although FIGS. 22–23 illustrate the heat spreader recesses 304 having substantially sloped recess sidewalls 308, it is understood that substantially vertical sidewalls may be used.

Figure 24:
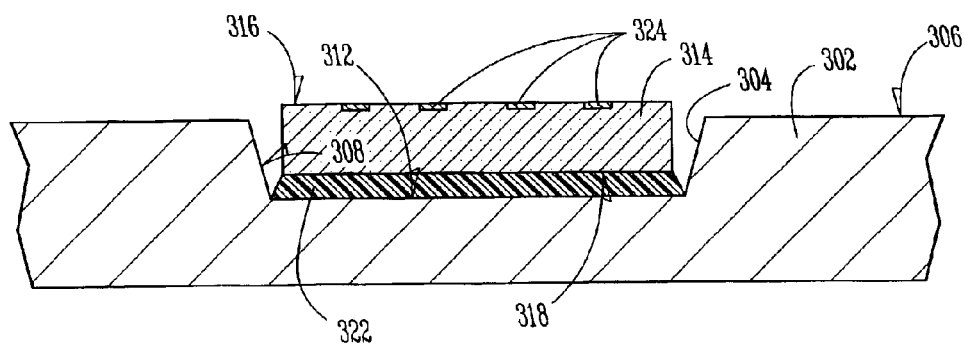

FIG. 24 illustrates a microelectronic die 314, having an active surface 316 and a back surface 318, placed in corresponding heat spreader recess 304 (see FIG. 23), wherein the recess 304 is appropriately sized and shaped to receive the microelectronic die 314. Fiducial marks (not shown) on both microelectronic die 314 and heat spreader 302 may be used for alignment. In the embodiment shown in FIG. 24, the microelectronic die 314 is attached to the bottom surface 312 of the recess 304 with a thermally conductive adhesive material 322. The adhesive material 322 may comprise a resin or epoxy material filled with thermally conductive particulate material, such as silver or aluminum nitride. The adhesive material 322 may also comprise metal and metal alloys having low melting temperature (e.g., solder materials), and the like.

Figure 25:
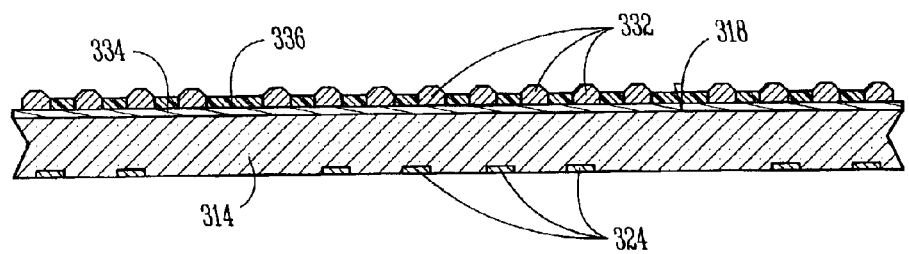

In another embodiment, a self-aligning solder process may be used to attach the microelectronic die 314 to the recess bottom surface 312. FIGS. 25–29 illustrate a self-aligning solder process to simply and accurately place the microelectronic dice in the heat spreader recess 304 while providing thermal conduction between the microelectronic die 314 and a heat spreader 302. As shown in FIG. 25, the first plurality of solder bumps 332, preferably highly thermally conductive material such as a lead, tin, indium, gallium, bismuth, cadmium, zinc, copper, gold, silver, antimony, germanium, and alloys thereof, most preferably gold/silicon eutectic material, is formed across an entire wafer before the microelectronic die 314 is diced therefrom. This ensures that the first plurality of solder bumps 332 are positioned the same on all microelectronic dice 314 and to reduce cost. The first plurality of solder bumps 332 may be aligned with a feature, as a fiducial marker (not shown), on the front side of the wafer.

The first plurality of solder bumps 332 may be formed by first applying a wetting layer 334, such as a seed layer as known in the art, to the back surface of the wafer corresponding to the microelectronic die back surface 318. A removable solder dam 336, such as a photoresist, is patterned over the wetting layer 334 to prevent the solder of the first plurality of solder bumps 332 prematurely wetting across the wetting layer 334. The first plurality of solder bumps 332 may be formed by a plating technique or by screen printing a paste into opening in the photoresist and reflowing the paste to form the solder bumps.

Figure 26:
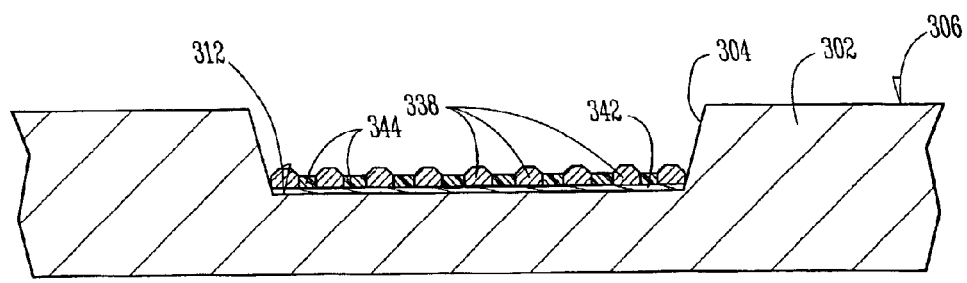

As shown in FIG. 26, a second plurality of solder bumps 338 may be disposed on the bottom surface 312 of the heat spreader recess 304, with a wetting layer 342 and a removable solder dam 344, using the technique described above. The second plurality of solder bumps 338 may be made from materials such as described for the first plurality of solder bumps 332. The second plurality of solder bumps 338 may be aligned with a feature, such as a fiducial marker (not shown) on the heat spreader 302. Alternately, to save cost and simplify the process, either the first plurality of solder bumps 332 or the second plurality of solder bumps 338 may be eliminated, so that just the wetting layer and the patterned solder layer would be present on the corresponding surface.

Figure 27:
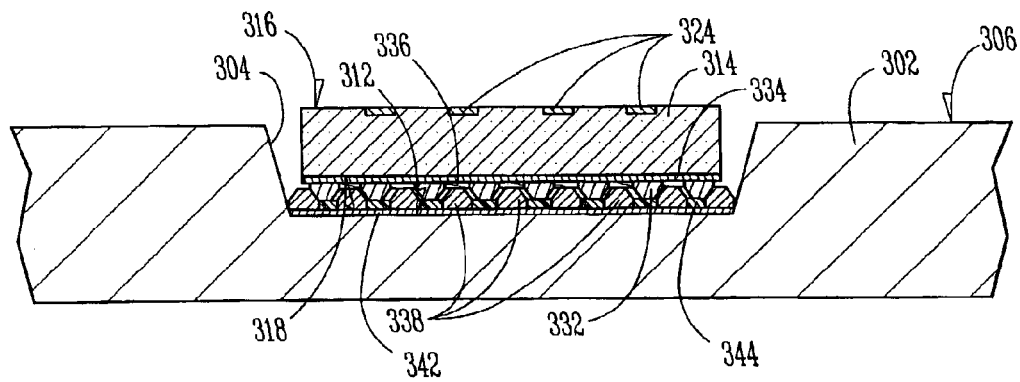

As shown in FIG. 27, the microelectronic die 314 (after dicing) is placed within the heat spreader recess 304 wherein the first plurality of solder bumps 332 and the second plurality of solder bumps 338 align the microelectronic die 314 into a desired position. The first plurality of solder balls 332 and the second plurality of solder balls 338 may be of differing sizes and composition for initial alignment and final thermal contact. It is, of course, understood that one could apply solder bumps to either the microelectronic die 314 or the heat spreader recess 304 alone.

Figure 28:
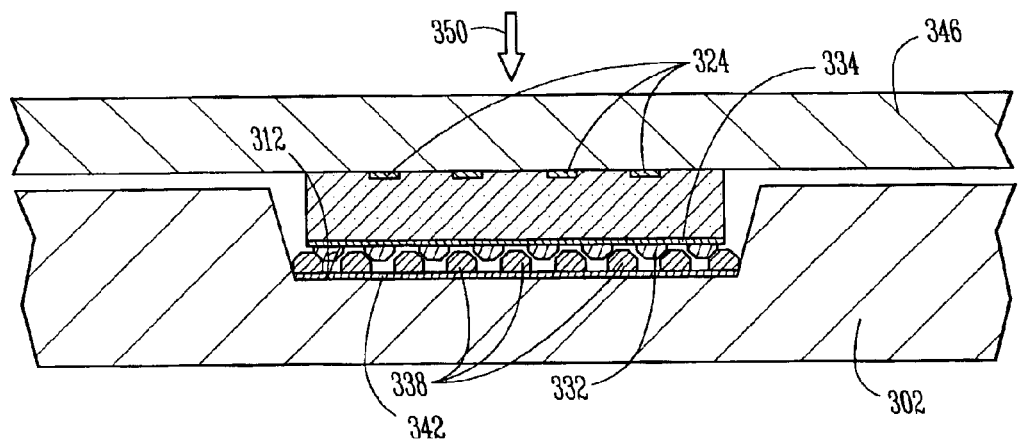
Figure 29:
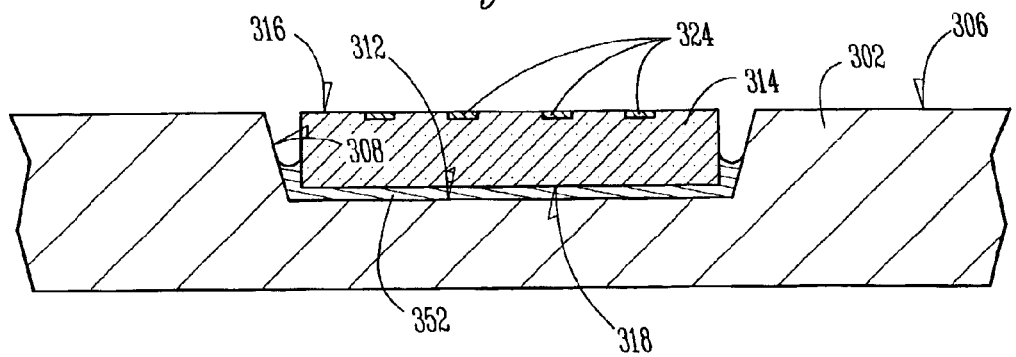

The heat spreader 302 is heated to or above the melting point of the first plurality of solder bumps 332 and the second plurality of solder bumps 338 to reflow the same, wherein capillary action between the bumps aligns the microelectronic die 314. The microelectronic die removable solder dam 336 and the heat spreader removable solder dam 344 are then removed, such as by a photoresist strip process as known in the art. Next, as shown in FIG. 28, a platen 346 is placed against the microelectronic die active surface 316 to hold the microelectronic die 314 in place horizontally while compressing vertically and heating under a vacuum or partial vacuum to again reflow the solder of the first plurality of solder balls 332 and the second plurality of solder balls 338. In this process, any relative horizontal movement should be avoided by pressing vertically in direction 350. The pressure is not released until after the solder has cooled below its melting temperature. This results in a substantially continuous thermal contact solder layer 352 between the microelectronic die back surface 318 and the recess bottom surface 312, as shown in FIG. 29. The vacuum or partial vacuum helps prevent or eliminate the presence of air bubbles within the substantially continuous thermal contact solder layer 352. The use of the platen 346 (see FIG. 28) also results in the heat spreader top surface 306 and the microelectronic die active surface 316 being substantially coplanar, as also shown in FIG. 29.

Figure 30:
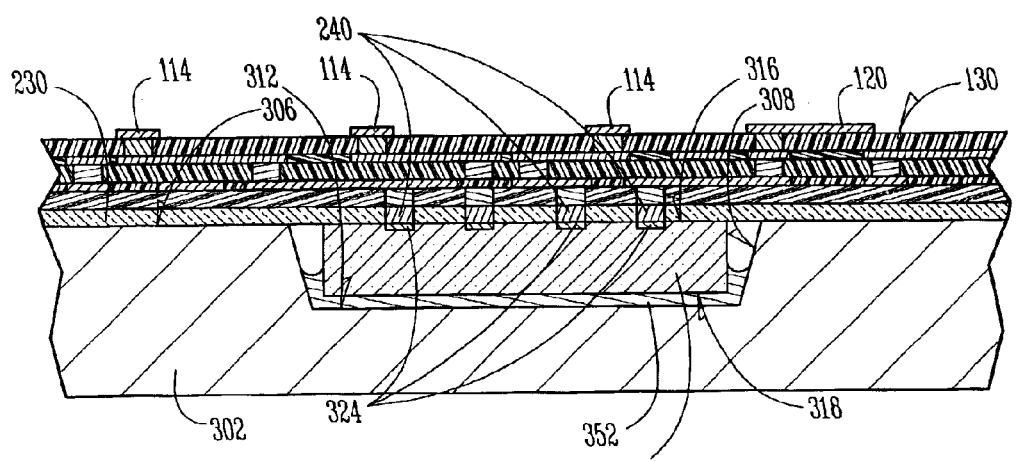
Figure 31:
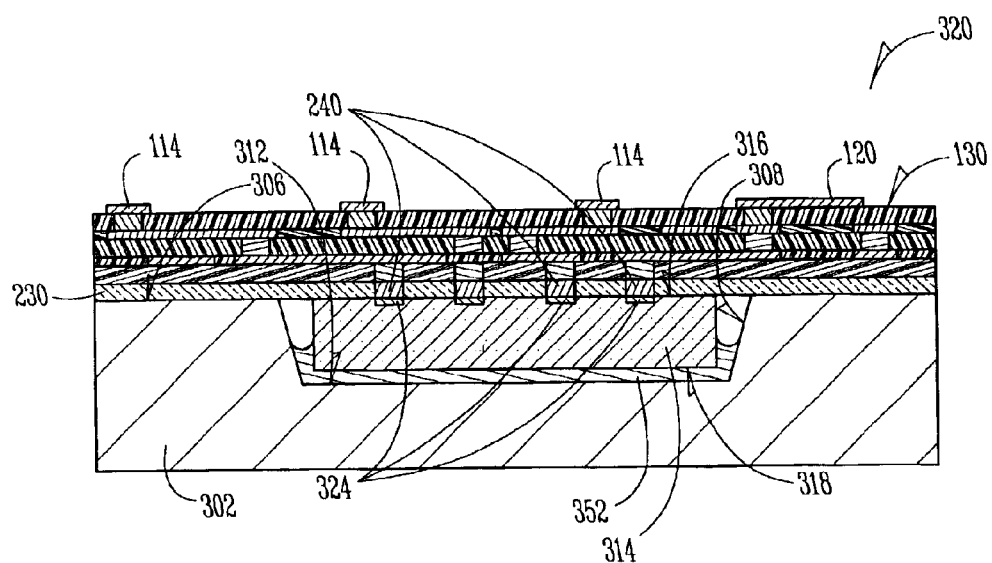

As previously discussed, the laminated interconnector 130 is then attached to the microelectronic die active surface 316 and the heat spreader first surface 306, as shown in FIG. 30. The individual microelectronic dice 314 may then be singulated through the laminated interconnector 130 and the heat spreader 302 to form at least one singulated microelectronic die package 320, as shown in FIG. 31. It is also understood that the individual microelectronic die 314 may be singulated first and a simulated interconnector 130 attached thereto, which may eliminate die-to-die alignment problems, to form the singulated microelectronic die package 320 directly.

Figure 32:
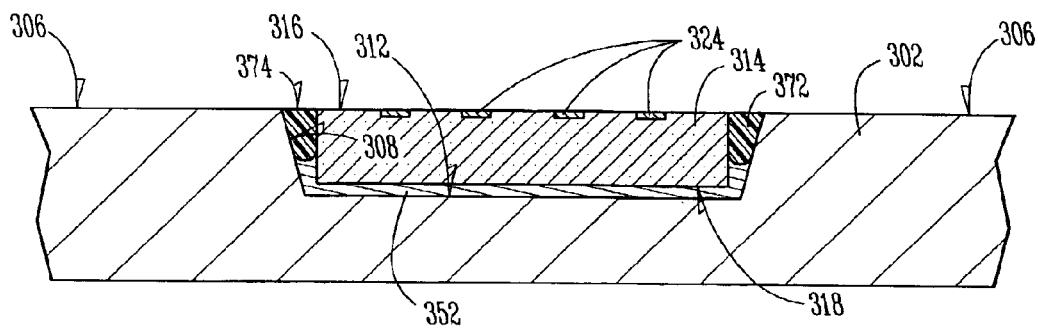
Figure 33:
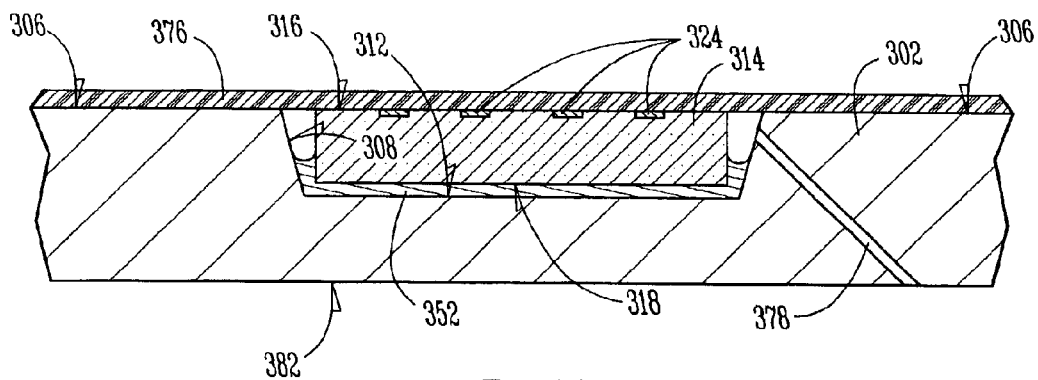

In an alternate embodiment, a filler material 372, such as plastics, resins, epoxies, and the like, may be disposed into any remaining gap between the microelectronic die 314 and the recess sidewalls 308 to form a planar surface 374 of the filler material 372 between the microelectronic die active surface 316 and the heat spreader first surface 306, as shown in FIG. 32. This may be achieved by placing a tape film 376 over the microelectronic die active surface 316 and the heat spreader first surface 306, as shown in FIG. 33. The tape film 376 is preferably a substantially flexible material, such as Kapton® polyimide film (E. I. du Pont de Nemours and Company, Wilmington, Del.), but may be made of any appropriate material, including metallic films, having an adhesive, such as silicone, disposed thereon. The filler material 372 (not shown) is injected through at least one channel 378 extending from a heat spreader second surface 382 to the recess sidewall 308.

Figure 34:
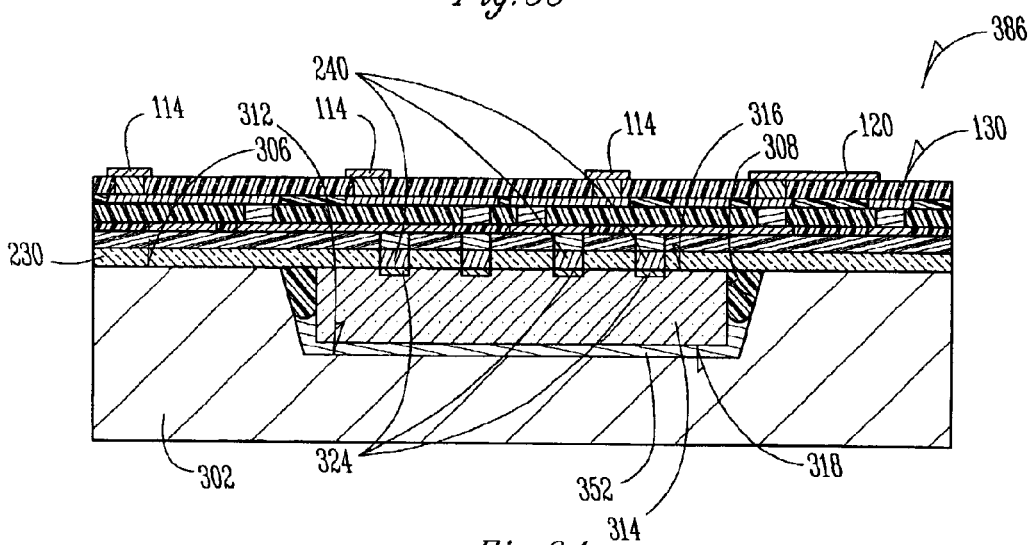
Figure 35:
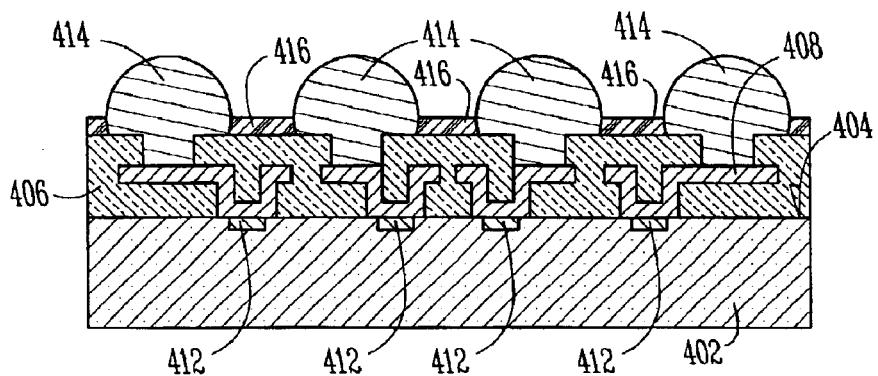
FIG. 35 is a side cross-sectional view of a true CSP of a microelectronic device, as known in the art.
Figure 36:
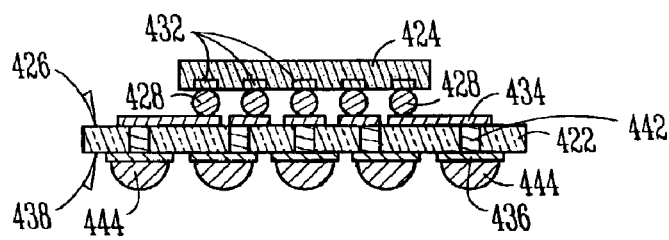
FIG. 36 is a cross-sectional view of a CSP of a microelectronic device utilizing a substrate interposer, as known in the art.
Figure 37:
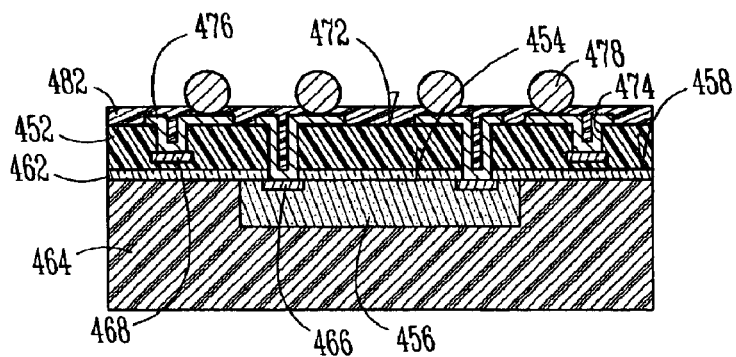
FIG. 37 is a cross-sectional view of a CSP of a microelectronic device utilizing a flex component interposer, as known in the art.

The tape film 376 is removed and, as previously discussed, the laminated interconnector 130 may then be attached to the microelectronic die active surface 316 and the heat spreader first surface 306. The individual microelectronic dice 314 may then be singulated through the laminated interconnector 130 and the heat spreader 302 to form at least one singulated microelectronic die package 386, as shown in FIG. 34. It is also understood that the individual microelectronic die 314 may be singulated first and a singulated interconnector 130 attached thereto, which may eliminate die-to-die alignment problems, to form the singulated microelectronic die package 386 directly.

In another embodiment, the laminated interconnector 130 can first be attached to the microelectronic die 314 and the heat spreader 302. Then, the encapsulation material 372 may be introduced into the gap between the laminated interconnector 130, and microelectronic die 314, and the heat spreader 302 through channel 378.

The present invention will result in low inductance for land-side capacitors due to microelectronic package thinness. Further, there is inherent scalability due to the lack of need for solder bumps at the microelectronic die level. Moreover, cost savings will also be realized, as no complex assembly is required.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package, comprising:
   providing at least one microelectronic die having an active surface and at least one side;
   abutting a protective film against said at least one microelectronic die active surface;
   encapsulating said at least one microelectronic die with an encapsulation material adjacent said at least one microelectronic die side, wherein said encapsulating material provides at least one surface of said encapsulation material substantially planar to said microelectronic die active surface;
   removing said protective film; and
   abutting a laminated interconnector proximate said microelectronic die active surface and said encapsulation material surface, wherein said laminated interconnector makes electrical contact with said microelectronic die active surface.

2. The method of claim 1, wherein abutting said laminated interconnector against said microelectronic die active surface further comprises attaching a conductive plug of said laminated interconnector to an electrical contact of said microelectronic die active surface with a conductive adhesive.

3. The method of claim 1, further including:
   disposing the microelectronic die in a microelectronic package core having a first surface and an opposing second surface, said microelectronic package core having at least one opening defined therein extending from said microelectronic package core first surface to said microelectronic package core second surface.

4. The method of claim 3, wherein disposing the microelectronic die includes disposing at least one microelectronic die into at least one opening in the microelectronic package core.

5. The method of claim 4, further including:
   singulating the at least one microelectronic die.

6. The method of claim 1, further including:
   disposing the microelectronic die in a recess of a heat spreader having a first surface, wherein the recess is defined therein by at least one sidewall extending from said heat spreader first surface to a recess bottom surface.

7. The method of claim 6, wherein disposing the microelectronic die includes disposing at least one microelectronic die into at least one microelectronic die recess.

8. The method of claim 7, further including: singulating the at least one microelectronic die.

9. A method of fabricating a microelectronic package, comprising:
   providing a microelectronic package core having a first surface and an opposing second surface, said microelectronic package core having at least one opening defined therein extending from said microelectronic package core first surface to said microelectronic package core second surface;
   disposing at least one microelectronic die within said at least one opening, said at least one microelectronic die having an active surface;
   adhering said microelectronic package core to said at least one microelectronic die with an encapsulation material including an encapsulation material surface; and
   abutting a laminated interconnector proximate said microelectronic die active surface and said encapsulation material surface, wherein said laminated interconnector makes electrical contact with said microelectronic die active surface.

10. A method of claim 9, wherein abutting said laminated interconnector against said microelectronic die active surface further comprises attaching a conductive plug of said laminated interconnector to an electrical contact of said microelectronic die active surface with a conductive adhesive.

11. The method of claim 9, wherein said providing said microelectronic package core comprises providing a microelectronic package core selected from the group consisting of bismaleimide triazine resin based laminate material, an FR4 laminate material, polyimide laminates, ceramics, and metals.

12. The method of claim 9, further including abutting said microelectronic package core first surface and said microelectronic die active surface against a protective film prior to adhering said microelectronic package core to said at least one microelectronic die with an encapsulation material.

13. The method of claim 12, wherein abutting said microelectronic package core first surface and said microelectronic die active surface against a protective film comprises abutting said microelectronic package core first surface and said microelectronic die active surface against an adhesive layer on said protective film prior to adhering said microelectronic package core to said at least one microelectronic die with an encapsulation material.

14. A method of fabricating a microelectronic package, comprising:
   providing a heat spreader having a first surface, said heat spreader having at least one recess defined therein by at least one sidewall extending from said heat spreader first surface to a recess bottom surface;
   disposing at least one microelectronic die within said at least one recess, said at least one microelectronic die having an active surface, a back surface, and at least one side;
   adhering said at least one microelectronic die back surface to said recess bottom surface; and
   disposing a laminated interconnector proximate said microelectronic die active surface and said heat spreader, wherein said laminated interconnector makes electrical contact with said microelectronic die active surface and wherein disposing said laminated interconnector against said microelectronid die active surface further comprises attaching conductive plug of said laminated interconnector to an electrical contact of said microelectronic die active surface with a conductive adhesive.

15. A method of fabricating a microelectronic package, comprising:
   providing a heat spreader having a first surface, said heat spreader having at least one recess defined therein by at least one sidewall extending from said heat spreader first surface to a recess bottom surface;
   disposing at least one microelectronic die within said at least one recess, said at least one microelectronic die having an active surface, a back surface, and at least one side;
   adhering said at least one microelectronic die back surface to said recess bottom surface, wherein adhering said at least one microelectronic die back surface to said recess bottom surface comprises adhering said at least one microelectronic die back surface to said bottom surface with a thermally conductive material selected from the group consisting of metal and metal alloys; and
   disposing a laminated interconnector proximate said microelectronic die active surface and said heat spreader, wherein said laminated interconnector makes electrical contact with said microelectronic die active surface: and disposing a filler material in gaps between said at least one recess sidewall and said at least one microelectronic die side.

16. The method of claim 15, wherein adhering said at least one microelectronic die back surface to said recess bottom surface comprises:
   disposing a plurality of solder bumps on at least one of said at least one microelectronic die back surface and said recess bottom surface, wherein said plurality of solder bumps includes a first plurality disposable on said microelectronic die back surface and a second plurality of solder bumps disposable on said recess bottom surface; and
   forming a substantially continuous solder layer between said at least one microelectronic die back surface and said recess bottom surface by reflowing said plurality of solder bumps.

17. The method of claim 16, wherein disposing a first plurality of solder bumps comprises:
   patterning a solder dam material on said at least one microelectronic die back surface; and
   forming said first plurality of solder bumps extending through said solder dam material.

18. The method of claim 16, wherein disposing a second plurality of solder bumps comprises:
   patterning a solder dam material on said recess bottom surface; and
   forming said second plurality of solder bumps extending through said solder dam material.

19. The method of claim 16, wherein disposing a plurality of solder bumps on at least one of said at least one microelectronic die back surface and said recess bottom surface comprises:
   disposing a first plurality of solder bumps on said at least one microelectronic die back surface comprises patterning a solder dam material on said at least one microelectronic die back surface, and forming said first plurality of solder bumps extending through said solder dam material;
   disposing a second plurality of solder bumps on said recess bottom surface comprises patterning a solder dam material on said recess bottom surface, and forming said second plurality of solder bumps extending through said solder dam material; and
   wherein forming a substantially continuous solder layer between said at least one microelectronic die back surface and said recess bottom surface comprises:
   reflowing said first plurality of solder bumps and said second plurality of solder bumps to align said at least one microelectronic die within said recess;
   removing said solder dam material on said at least one microelectronic die back surface and on said recess bottom surface; and
   holding said at least one microelectronic die in place while the first solder bumps and said second plurality of solder bumps are again reflowed.

20. The method of claim 19, further including inducing at least a partial vacuum during said forming said substantially continuous solder layer.

* * * * *